United States Patent
Williams

(10) Patent No.: US 7,622,893 B2
(45) Date of Patent: Nov. 24, 2009

(54) METHOD AND APPARATUS FOR MEASURING THE VOLTAGE OF A POWER SOURCE

(75) Inventor: James Michael Williams, Palo Alto, CA (US)

(73) Assignee: Linear Technology Corporation, Milpitas, CA (US)

( * ) Notice: Subject to any disclaimer, the term of this patent is extended or adjusted under 35 U.S.C. 154(b) by 338 days.

(21) Appl. No.: 11/717,126

(22) Filed: Mar. 13, 2007

(65) Prior Publication Data
US 2008/0231257 A1 Sep. 25, 2008

(51) Int. Cl.
*H01M 10/46* (2006.01)
(52) U.S. Cl. .................................... 320/112
(58) Field of Classification Search ............. 320/107, 320/112, 134, 136, 141, 116, 157, 162
See application file for complete search history.

(56) References Cited

U.S. PATENT DOCUMENTS

| | | | | |
|---|---|---|---|---|
| 3,673,485 A | * | 6/1972 | Vital et al. | 320/128 |
| 4,389,608 A | * | 6/1983 | Dahl et al. | 320/137 |
| 4,929,871 A | * | 5/1990 | Gerfast | 315/205 |
| 5,920,190 A | | 7/1999 | Peterson et al. | |
| 6,002,238 A | * | 12/1999 | Champlin | 320/134 |
| 6,236,216 B1 | | 5/2001 | Shimoyama et al. | |
| 6,717,391 B2 | | 4/2004 | Linkowsky et al. | |

FOREIGN PATENT DOCUMENTS

| EP | 0 943 926 A1 | 9/1999 |
|---|---|---|
| EP | 1 122 854 A2 | 8/2001 |

OTHER PUBLICATIONS

International Preliminary Report on Patentability and Written Opinion of the International Searching Authority, issued in corresponding International Application No. PCT/US2007/022741, mailed on Jun. 16, 2008.

* cited by examiner

*Primary Examiner*—Edward Tso
(74) *Attorney, Agent, or Firm*—McDermott Will & Emery LLP

(57) ABSTRACT

Various concepts and techniques are disclosed for measuring the voltage of a power source. An apparatus includes a voltage metering circuit and a transformer having a first winding coupled to the voltage metering circuit and a second winding for coupling to a power source.

24 Claims, 6 Drawing Sheets

METHOD AND APPARATUS FOR MEASURING THE VOLTAGE OF A POWER SOURCE

BACKGROUND

1. Field

The present disclosure relates generally to the electrical arts, and more particularly, to concepts and techniques for measuring the voltage of a power source.

2. Background

Determining the voltage of a single cell battery is a straightforward procedure. A conventional voltmeter is simply placed across the terminals of the cell and the voltage measured. This procedure, however, poses various technological challenges when measuring the cell voltages of a multiple cell battery. In particular, the voltmeter must be switched between the cells to determine the voltage of each cell. Moreover, the voltmeter, which is generally composed of relatively low voltage breakdown semiconductor based electronic components, must withstand the voltage measured at each cell in the battery with respect to ground. This voltage, which is often referred to as "common mode voltage," can reach hundreds of volts in large series connected battery stacks, such as those found in automobiles and other high voltage applications. These high voltage applications are beyond the voltage breakdown capabilities of most semiconductor components. Semiconductor based switches suffer from similar problems due to voltage breakdown limitations. Accordingly, there is a need in the art for isolated measurement techniques for batteries and other power sources.

SUMMARY

One aspect of an apparatus is disclosed. The apparatus includes a voltage metering circuit, and a transformer having a first winding coupled to the voltage metering circuit and a second winding for coupling to a power source.

Another aspect of an apparatus is disclosed. The apparatus includes a voltage metering circuit, and a plurality of transformers, each of the transformers having a first winding coupled to the voltage metering circuit and a second winding for coupling to a different battery cell of a multiple cell battery.

A further aspect of an apparatus is disclosed. The apparatus includes a transformer having a first winding and second winding, the second winding being configured for coupling to a power source, and means, coupled to the first winding of the transformer, for measuring the voltage of the power source.

Yet another aspect of an apparatus is disclosed. The apparatus includes a plurality of transformers, each of the transformers having first and second windings, the second winding in each of the transformer being configured for coupling to a different battery cell in a multiple cell battery, and means, coupled to the first winding in each of the transformers, for measuring the voltage of the battery cells.

An aspect of a method is disclosed for measuring the voltage of a power source using a transformer having first and second windings, the second winding being coupled to the power source. The method includes exciting the first winding, and sampling the voltage of the first winding when excited.

Another aspect of a method is disclosed for measuring battery cell voltages of a multiple cell battery using a plurality of transformers, each of the transformers having first and second windings, each of the second windings being configured for coupling to a different one of the battery cells. The method includes exciting the first winding in each of the transformers, and sampling the voltage of the battery cells through the excited first windings of the transformers.

An aspect of computer-readable media is disclosed. The computer-readable media contains instructions for a processor. The instructions include program code to measure a reference voltage through a reference transformer, and program code to use the reference voltage to measure the voltage of a power source through a transformer.

Another aspect of computer-readable media is disclosed. The computer-readable media contains instructions for a processor. The processor is configured to measure battery cell voltages of a multiple cell battery using a plurality of transformers, each of the transformers being coupling to a different one of the battery cells. The instructions include program code to measure a reference voltage through a reference transformer, and program code to use the reference voltage to measure the voltage of the battery cells through the transformers.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention.

Figure 1:
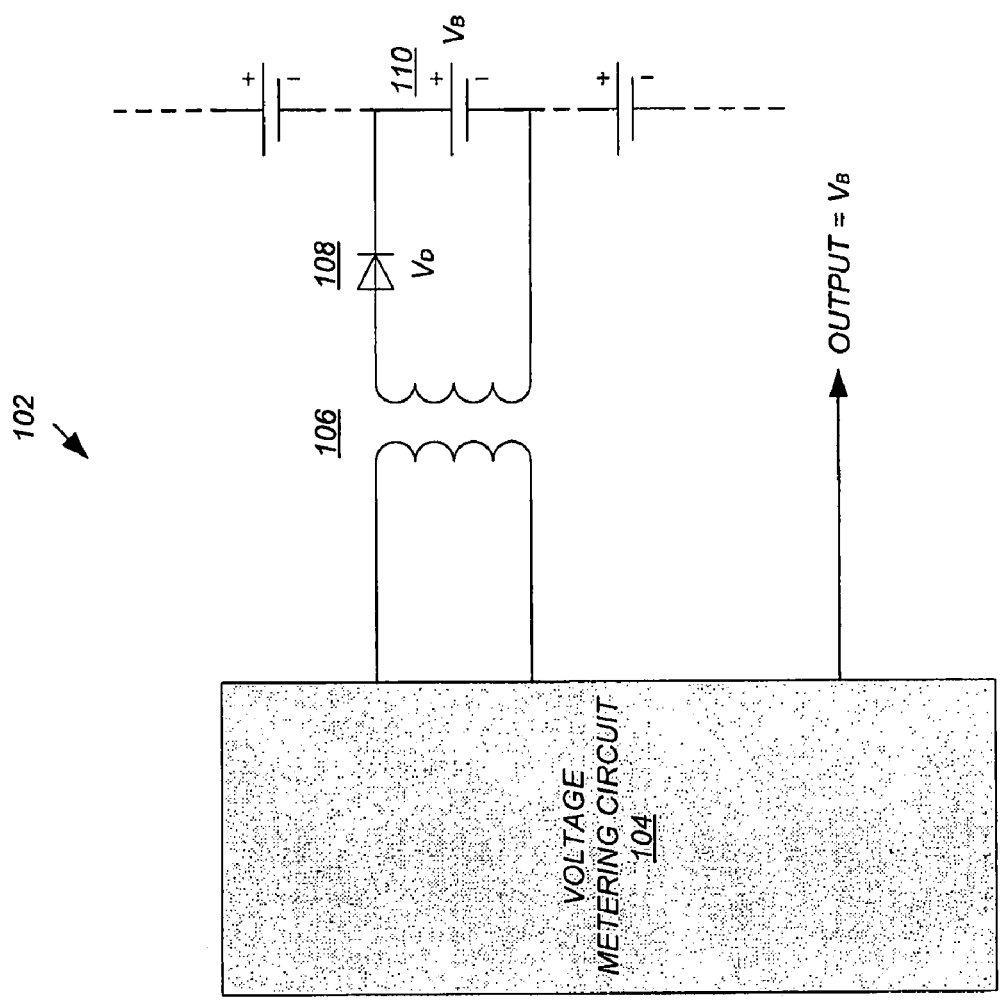
FIG. 1 is a diagram illustrating an exemplary embodiment of an apparatus for measuring the voltage of a power source.

FIG. 1 is a diagram illustrating an exemplary embodiment of an apparatus for measuring the voltage of a power source, such as a single cell battery, a multiple cell battery, a cell in a multiple cell battery, or some other suitable power source.

The apparatus 102 includes a voltage metering circuit 104 and a transformer 106, which together provide a means measuring the voltage of a power source independently of high common mode voltages. In the embodiment of the apparatus shown in FIG. 1, the primary winding of the transformer 106 is coupled to the voltage metering circuit 104 and the secondary winding of the transformer 106 is coupled to a battery cell 110 under test. The term "coupled" as used throughout this disclosure means a direct connection, or where appropriate, an indirect connection (e.g., through intervening or intermediary devices or other means). An example of an indirect connection is shown in FIG. 1, where the secondary winding of the transformer 106 is coupled to the battery cell 110 through a diode 108 to prevent the cell 110 from short circuiting.

The voltage metering circuit 104 measures the voltage $V_B$ of the battery cell 110 by exciting the transformer 106 and sampling the voltage across the primary winding. This voltage is clamped by the diode voltage $V_D$ and the battery cell voltage $V_B$, which shunt the secondary winding of the transformer 106. The diode 108 and the losses in the transformer 106 introduce predictable errors that can be subtracted from the sampled voltage to produce an accurate measurement of the battery cell voltage $V_B$ at the output of the voltage metering circuit 104. The use of the transformer 106 galvanically isolates the battery cell 110 from the voltage metering circuit 104. This breaks the common ground connection and eliminates the common mode voltages. As a result, conventional low voltage techniques and semiconductors can be used to implement the voltage metering circuit 104.

Figure 2:
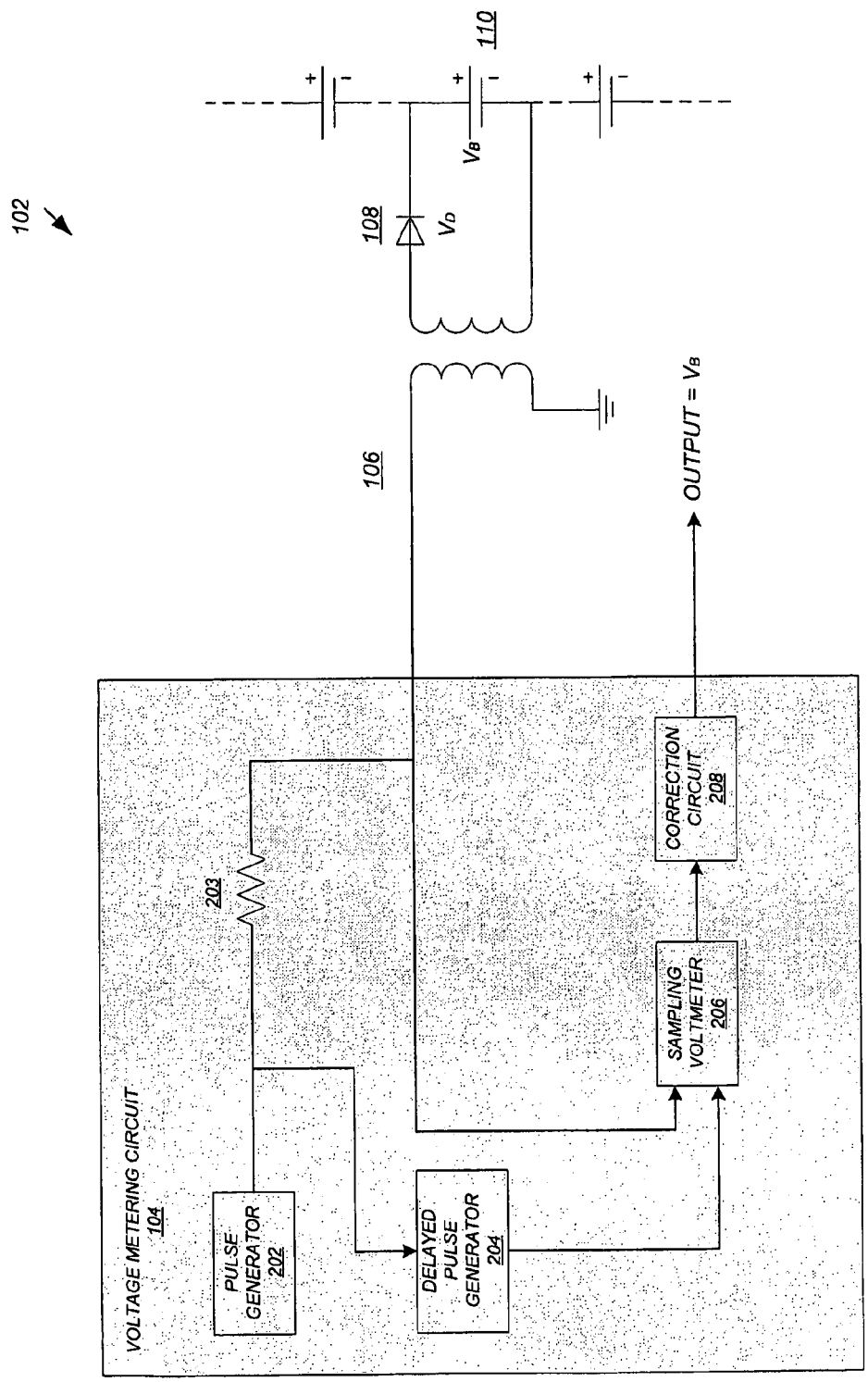
FIG. 2 is a diagram illustrating an exemplary embodiment of a voltage metering circuit.

FIG. 2 is a diagram illustrating an exemplary embodiment of a voltage metering circuit. The voltage metering circuit 104 includes a pulse generator 202 coupled to the primary winding of the transformer 106. The pulse generator 202 is used to excite the transformer 106 through a resistor 203. The pulse generator 202 also triggers a delayed pulse generator 204. The delayed pulse generator 204 enables a sampling voltmeter 206 to sample the voltage across the primary winding of the transformer 106. A correction circuit 208 removes the residual error terms (i.e., the diode 108 voltage and the transformer losses) from the sampled voltage to produce an output representing the battery cell voltage $V_B$.

Figure 3:
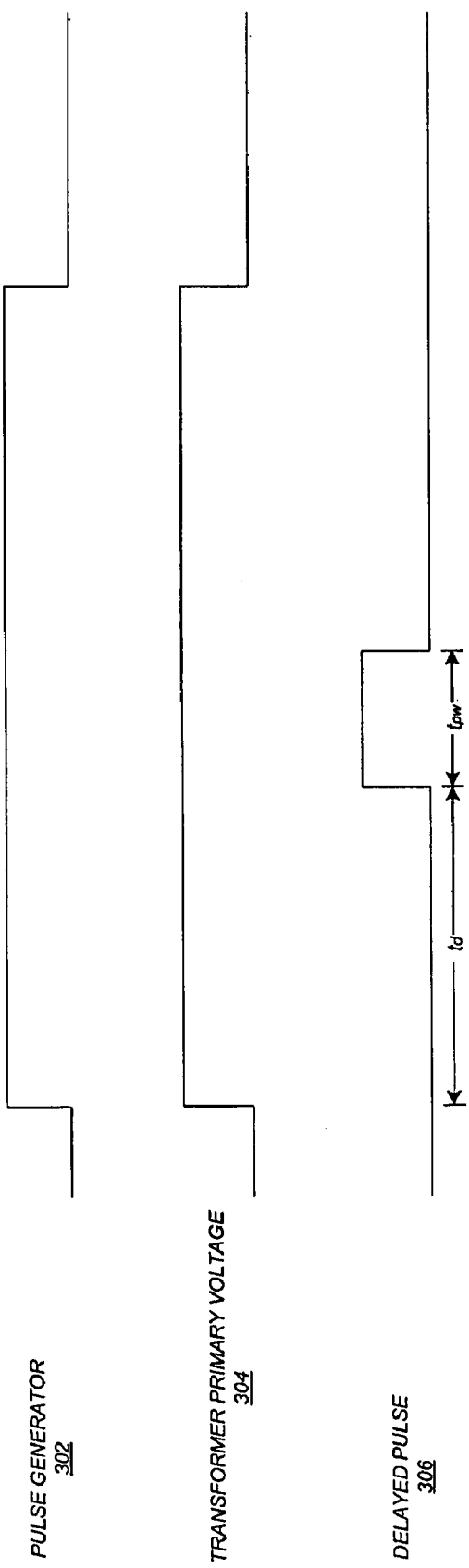
FIG. 3 is a timing diagram illustrating various waveforms generated in a voltage metering circuit.

FIG. 3 is a timing diagram illustrating various waveforms generated in the voltage metering circuit 104. Referring to FIGS. 2 and 3, the pulse generator 202 is used to generate a pulse 302 to excite the transformer 106. When the transformer 106 is excited, a voltage waveform 304 appears across the primary winding, which as explained above, is clamped by the battery cell voltage $V_B$ and the diode voltage $V_D$. For clarity of presentation, the rise time, overshoot, voltage droop, and pulse distortion of the waveform across the primary winding of the transformer are not shown. The delayed pulse 306 generated by the delayed pulse generator 206 is delayed from the rising edge of the pulse 302 generated by the pulse generator 202 by $t_d$. The delay $t_d$ is set to ensure that voltage across the primary winding of the transformer is clamped before it is sampled by the sampling voltmeter 208. The required delay $t_d$ is primarily a function of output impedance of the pulse generator 202, the resistor 203, and the characteristics of the transformer 106. The pulse width $t_{pw}$ of the delayed pulse 306 is set to ensure that the sampling voltmeter 208 has sufficient time to sample the voltage, which will be discussed further below.

Figure 4:
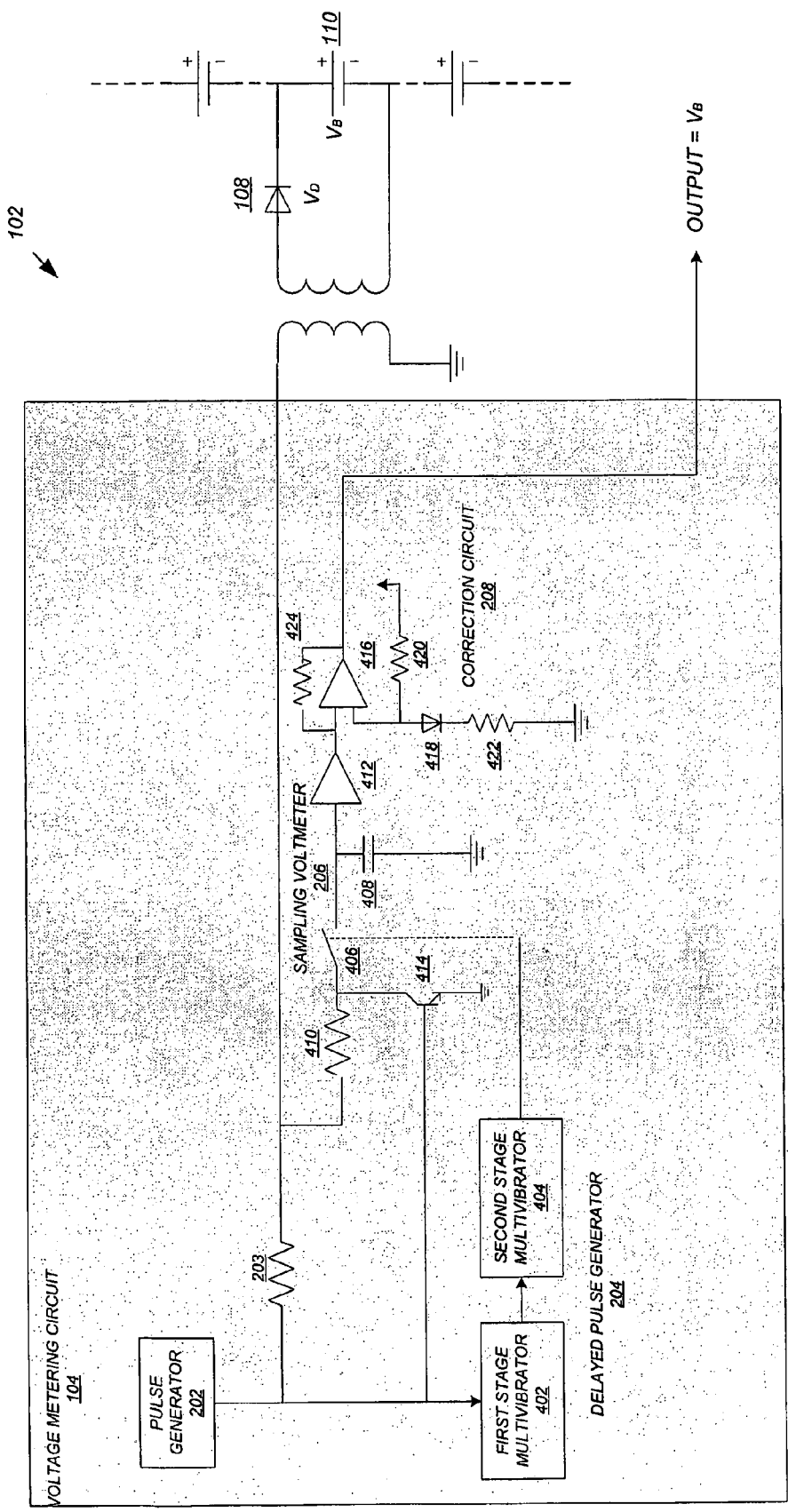
FIG. 4 is an electrical schematic diagram illustrating an exemplary embodiment of a voltage metering circuit.

FIG. 4 is an electrical schematic diagram illustrating an exemplary embodiment of a voltage metering circuit. The transformer 106 is excited by a pulse generator 202 through a low impedance driver (not shown). The driver may be internal or external to the pulse generator 202. An external driver can be implemented, by way of example, with a parallel arrangement of 74HC04 inverters or other suitable devices. In one embodiment of the voltage metering circuit 104, the pulse generate excites the transformer 106 with a 5 volt, 10 μs pulse at a 500 Hz repetition rate through a 10 KΩ resistor 203, but other voltages, waveforms, pulse widths, repetition rates, and resistive values may be used in other embodiments.

The delayed pulse generator 206 may be implemented with a dual retriggerable monostable multivibrator, such as a 74HC123, or other suitable device. The 74HC123 is a high speed CMOS device with dual multivibrators integrated into a single package. When implemented using a 74HC123, a first stage multivibrator 402 is used to set the delay $t_d$. More specifically, the first stage multivibrator 402, which is triggered by the pulse generator 202, generates a pulse having a width established by an external resistor and capacitor pair (not shown). The trailing edge of the pulse generated by the first stage multivibrator 402 is used to trigger a second stage multivibrator 404. The second stage multivibrator 404 generates a pulse having a width established by another external resistor capacitor pair. The pulse output from the second stage multivibrator 404 is used to enable the sampling voltmeter 206.

The sampling voltmeter 208 is shown with a switch 406, a capacitor 408, and a buffer 412. In this embodiment, the delayed pulse from the delayed pulse generator 204 closes the switch 406, allowing the capacitor 408 to charge through a resistor 410 towards the clamped voltage across the primary winding of the transformer 106. The pulse width $t_{pw}$ of the delayed pulse 306 (see FIG. 3) must be sufficient to allow the capacitor 408 to fully charge to the clamped voltage before the switch 406 is opened. The required pulse width $t_{pw}$ is primarily a function of the time constant established by the resistor 410 and capacitor 408. In one embodiment of the voltage metering circuit 104, a 0.001 F capacitor 408 is driven through a 10 KΩ resistor 410 when a CD4016 CMOS analog switch is closed by the delayed pulse generator 204. A transistor 414 may be used to pull down the switch input to ground just before the trailing edge of the pulse 302 (see FIG. 3) from the pulse generator 202. This prevents the negative excursions at the primary winding of the transformer 106 from influencing the switch 406. The buffer 412, which may be implemented with a LTC6240 unity gain CMOS operational amplifier or other suitable device, is used to buffer the capacitor voltage and provide it to the correction circuit 208.

The correction circuit 220 includes an amplifier 416, such as a LT1789 or other suitable device. The amplifier 416, operating at a gain close to unity, subtracts the diode voltage $V_D$ and the losses from the transformer 106 to produce an output representing the battery cell voltage $V_B$. A diode 418 in the input circuitry is use to subtract the error introduced by the diode 106 between the secondary winding of the transformer 106 and the battery cell 110. Preferably, the diodes are matched so they contribute little error and track with temperature. This may be achieved, by way of example, using matching 2N3904 transistors configured as diodes. The transformer losses can be represented by an offset component and a gain component. Input resistors 420, 422 compensate for the offset component and a feedback resistor 424 compensates for the gain component. The values of the resistors will depend on the characteristics of the transformer 106 as well as other parameters of the voltage metering circuit 104. In one embodiment of the voltage metering circuit 104, the correction circuit 208 is implemented with 22 KΩ and 511 Ω input resistors 420, 422, and a 6.34 MΩ feedback resistor 424, however, the resistive values used in any specific application may be different and the selection of these values are well within the capabilities of one skilled in the art.

Figure 5:
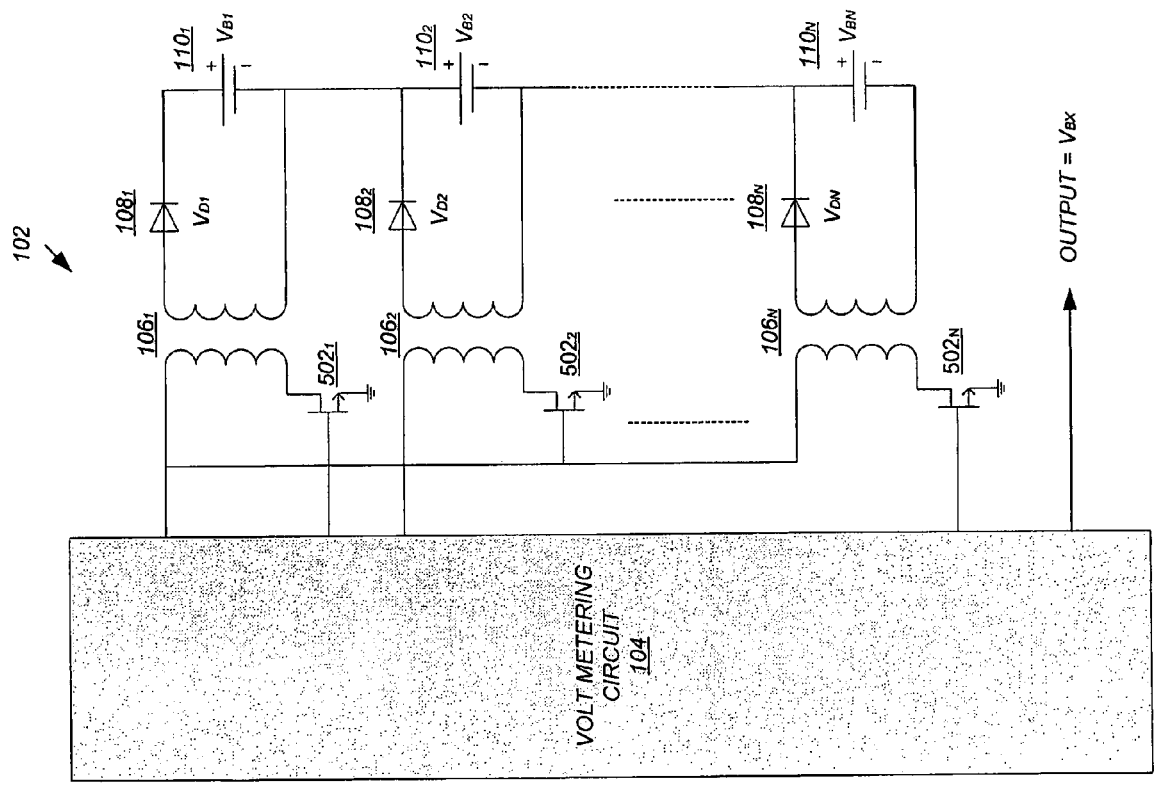
FIG. 5 is a diagram illustrating an exemplary embodiment of an apparatus for measuring the voltage of each cell in a multiple cell battery.

FIG. 5 is a diagram illustrating an exemplary embodiment of an apparatus for measuring the voltage of each cell in a multiple cell battery. In this embodiment, a separate transformer $106_x$ is used to measure the voltage $V_{BX}$ of each battery cell $110_x$, but fewer transformers may be used in a time-shared fashion in other embodiments. Each transformer $106_x$ includes a primary winding coupled between the voltage metering circuit 104 and ground through a switch $502_x$, and a secondary winding coupled to a battery cell $110_x$ through a diode $108_x$. The switch $502_x$ may be positioned between the primary winding and ground as shown in FIG. 5, or alternatively, located elsewhere. By way of example, the switch $502_x$ may be placed in the voltage metering circuit 104, between the voltage metering circuit 104 and the primary winding, or in the secondary winding circuit. The switches $502_x$ may be FET switches, or any other suitable switches.

The voltage metering device 104 can measure the voltage $V_B$ of any battery cell $110_x$ by enabling the corresponding transformer $106_x$ and disabling the others. By way of example, the voltage metering device 104 can measure the voltage $V_{B1}$ of the first battery cell $110_1$ by applying the appropriate gate voltages to turn the first FET switch $502_1$ ON and the remaining FET switches $502_2$-$502_N$ OFF. With this switch configuration, a pulse from the voltage metering circuit 104 will excite the first transformer $106_1$, causing a voltage to build up across the primary winding until it is clamped by the diode voltage $V_{D1}$ and the battery cell voltage $V_{B1}$. The voltage metering circuit 104 samples the voltage across the primary winding of the first transformer and removes the residual error to arrive at the battery cell voltage $V_{B1}$ for the first cell $110_1$. This process may be repeated for each battery cell, or any combination of battery cells.

Figure 6:
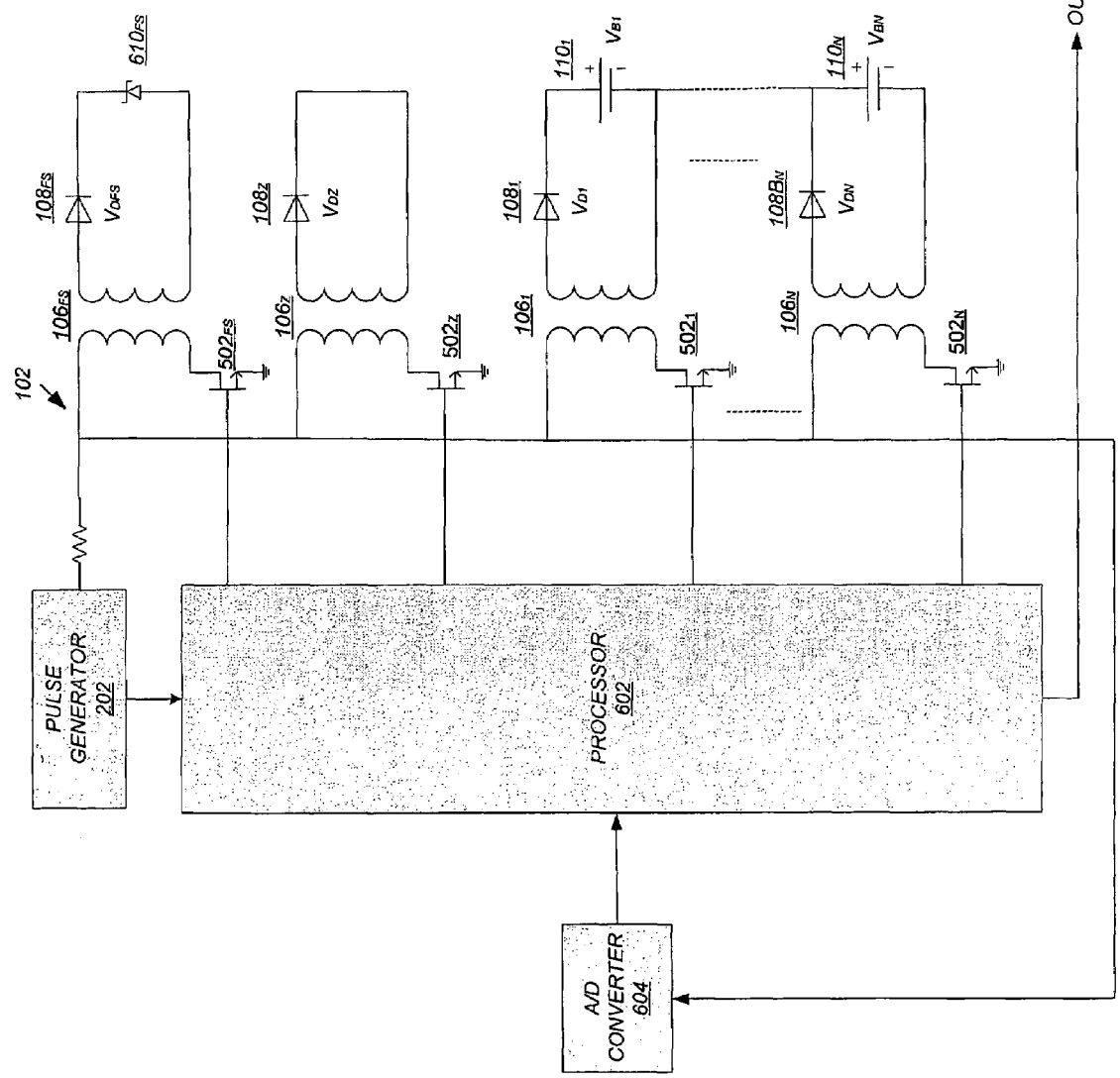
FIG. 6 is a diagram illustrating another exemplary embodiment of an apparatus for measuring the voltage of each cell in multiple cell battery.

FIG. 6 is a diagram illustrating another exemplary embodiment of an apparatus for measuring the voltages of cells in multiple cell battery. In this embodiment, the voltage measurements are made using an automatic calibration technique. This technique may be implemented with a processor 602 that selects the transformers $106_x$ corresponding to the battery cells $110_x$ of interest and controls the pulse generator 202 to excite the selected transformers $106_x$. An analog-to-digital (A/D) 604 converter is used to provide to the processor 602 with a digital representation of the sampled voltage across the primary winding of the selected transformer $106_x$.

Two additional transformers $106_{FS}$, $106_Z$ are used for calibration. The first transformer $106_{FS}$ has a secondary winding coupled through a diode $108_{FS}$ to a full-scale voltage reference $610_{FS}$ and the second transformer $106_Z$ has a shorted secondary winding through a diode $108_Z$ to provide a zero reference. In this example, the full-scale voltage reference $610_{FS}$ represent the maximum battery cell voltage and zero reference represents the minimum battery cell voltage. In other embodiments, a minimum battery cell voltage may be calibrated with a low-scale voltage reference across the secondary winding of the transformer $106_Z$. The voltage full-scale voltage reference $610_{FS}$ may be implemented with zener diode as shown, or by any other suitable means.

In operation, the processor 602 is calibrated by measuring and recording the full-scale voltage reference $606_{FS}$ and the zero reference. The full-scale voltage reference $606_{FS}$ is measured by enabling the corresponding transformer $106_{FS}$ via a switch $502_{FS}$ and triggering the pulse generator 202 to excite the transformer $106_{FS}$ for the full-scale voltage reference. The voltage across the primary winding is converted to a digital value by the A/D converter 604 and stored. The processor 602 repeats this process for the zero reference enabling the appropriate transformer $106_Z$ through a switch $502_Z$, triggering the pulse generator 202 to excite the transformer $106_Z$ for the zero reference and storing the digital value representing the voltage measured across the primary winding.

Once the full-scale voltage reference and zero reference have been recorded, the processor 602 can measure the voltage $V_{Bx}$ of any battery cell $110_x$ through a interpolation process, or by some other suitable mathematical function. As an example, the processor 602 can measure the voltage $V_{B1}$ of the first battery cell $110_1$ by applying the appropriate gate voltages to turn the first FET switch $502_1$ ON and the remaining FET switches OFF. With this switch configuration, a pulse from the voltage metering circuit 104 will excite the first transformer 1061, causing a voltage to build up across the primary winding until it is clamped by the diode voltage $V_{D1}$ and the battery cell voltage $V_{B1}$. The voltage across the primary winding of the first transformer $106_1$ is converted to a digital value by the A/D converter 604 and provided to the processor 602. The processor 602 then uses the full-scale voltage reference and the zero reference to interpolate the result based on the digital value for the voltage measured across the primary winding of the first transformer $106_1$. This process may be repeated for each battery cell, or any combination of battery cells.

The process just described assumes that the diodes $108_x$ in the secondary windings of the transformers $106_x$ are matched. The process may be modified to account for any residual error introduced by unmatched diodes $108_x$. The modified process involves a pre-calibration technique whereby a known voltage reference is placed across the secondary winding of each transformer $106_1$-$106_N$ that will be used to measure the voltage $V_{Bx}$ of a battery cell. The processor 602 then excites the primary windings of each transformer $106_1$-$106_N$ and records a corresponding digital value from the A/D converter 604 to complete the pre-calibration process.

Once the pre-calibration process is complete, the secondary windings for each transformer $106_1$-$106_N$ is coupled to the individual cells of a battery. Using an interpolation process, or some other suitable mathematical function, the processor 602 can then measure the voltage $V_{Bx}$ of any batter cell $110_x$ using the digital value from the A/D converter 604 for the voltage across excited primary winding of the transformer $106_x$ coupled to the battery cell $110_x$ under test, the measured full-scale voltage and zero reference, and the pre-calibration data (i.e., the known voltage reference and the measured voltage).

The processor 602 has been described herein in terms of its functionality. These functions may be implemented in hardware, software, firmware, middleware, microcode, hardware description languages, or any combination thereof. In one non-limiting example, the processor 602 may be implemented with a general-purpose or specific-application processor, and may also include computer-readable media with program code or instructions that, when executed, performs some or all of the processor functions described herein. The computer-readable media may be memory or a hierarchy of memories including general register files, caches, volatile memory, and/or non-volatile memory. The program code or instructions may also be stored on computer-readable media external to the processor 602 including any medium that is used to transfer program code or instructions to the processor 602. By way of example, computer-readable media includes a connection to the processor from a website, server, or other remote source, or a carrier wave that encodes data.

A general-purpose processor may be a microprocessor. A specific-application processor may be an embedded processor, a digital signal processor (DSP), an application specific integrated circuit (ASIC), a controller, a microcontroller, a state machine, a field programmable gate array (FPGA) or other programmable logic component, discrete gate or transistor logic, or discrete hardware components. The processor 602 may also be implemented as a combination of processing entities (e.g., a combination of a DSP and a microprocessor, a plurality of microprocessors, one or more microprocessors in conjunction with a DSP core, or any other such configuration).

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but is to be accorded the full scope consistent with the language claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A system for determining cell voltage of a power source having multiple cells, the system comprising:
    a voltage sensing circuit for determining the cell voltage, and
    a transformer having a first winding configured for coupling to the voltage sensing circuit, and a second winding configured for coupling across terminals of a single cell of the power source via a unidirectional current conducting device,
    a single transformer being provided for determining voltage of the cell.

2. The system of claim 1, wherein the voltage sensing circuit comprises a sampling voltmeter coupled to the first winding.

3. The system of claim 1, wherein the voltage sensing circuit further comprises a pulse generator coupled to the first winding.

4. The system of claim 1, wherein the voltage sensing circuit comprises a pulse generator configured to excite the transformer, and a sampling voltmeter configured to sample the voltage across the first winding.

5. The system of claim 4, wherein the voltage sensing circuit further comprises a delayed pulse generator configured to enable the sampling voltmeter when the transformer is excited.

6. The system of claim 4, wherein the voltage sensing circuit further comprises a correction circuit configured to correct the sampled voltage for residual error.

7. The system of claim 6, wherein the residual error includes losses introduced by the transformer.

8. The system of claim 6, wherein the residual error includes error introduced by the unidirectional current conducting device.

9. A method of determining voltage of an individual cell of a power source having multiple cells using only a single transformer having first and second windings, the second winding being configured for coupling across terminals of the individual cell via a unidirectional current conducting device, the method comprising the steps of:
    exciting the first winding; and
    sampling voltage at the first winding when excited.

10. The method of claim 9, wherein the first winding is excited with a pulse.

11. The method of claim 9, further comprising the step of correcting the sampled voltage for residual error.

12. The method of claim 11, wherein the residual error includes losses introduced by transformer.

13. The method of claim 11, wherein the residual error includes error introduced by the unidirectional current conducting device.

14. A system for determining voltages of individual cells of a power source having multiple cells, the system comprising:
    a voltage determining circuit,
    a first transformer having a first winding configured for coupling to the voltage determining circuit via a first switch, and having a second winding configured for coupling across terminals of a first cell of the power source, and
    a second transformer having a first winding configured for coupling to the voltage determining circuit via a second switch, and having a second winding configured for coupling across terminals of a second cell of the power source,
    the voltage determining circuit being configured to turn on the first switch and turn off the second switch for determining voltage of the first cell,
    the voltage determining circuit being further configured to turn on the second switch and turn off the first switch for determining voltage of the second cell.

15. The system of claim 14, further comprising a first unidirectional current conducting device coupled to the second winding of the first transformer for providing a unidirectional current path between the first cell and the first transformer.

16. The system of claim 15, further comprising a second unidirectional current conducting device coupled to the second winding of the second transformer for providing a unidirectional current path between the second cell and the second transformer.

17. A method of sensing voltages of individual cells of a power source having multiple cells using a voltage sensing circuit, a first transformer having a first winding configured for coupling to the voltage determining circuit via a first switch, and having a second winding configured for coupling across terminals of a first cell of the power source, and a second transformer having a first winding configured for coupling to the voltage determining circuit via a second switch, and having a second winding configured for coupling across terminals of a second cell of the power source, the method comprising the steps of:
    sensing voltage of the first cell by turning on the first switch and turning off the second switch, and
    sensing voltage of the second cell by turning on the second switch and turning off the first switch.

18. The method of claim 17, wherein the step of sensing voltage of the first cell comprises exciting the first winding of the first transformer and sampling voltage at the first winding of the first transformer.

19. The method of claim 18, wherein the step of sensing voltage of the second cell comprises exciting the first winding of the second transformer and sampling voltage at the first winding of the second transformer.

20. A system for determining voltages of individual cells of a power source having multiple cells, the system comprising:
- a processing circuit,
- a first transformer having a first winding configured for coupling to the processing circuit, and having a second winding configured for coupling across terminals of a first cell of the power source via a first unidirectional current conducting device,
- a second transformer having a first winding configured for coupling to the processing circuit, and having a second winding configured for coupling across terminals of a second cell of the power source via a second unidirectional current conducting device, and
- a calibration circuit for providing reference values representing maximum and minimum cell voltages of the power source,
- the processing circuit being configured to determine voltages of the first and second cells using the reference values.

21. A computer-readable medium containing instructions executable by a processor, the processor being configured to determine cell voltages of a power source having multiple cells using a plurality of sensing transformers, each of the sensing transformers including a first winding configured for coupling to the processor, and a second winding configured for coupling across terminals of an individual cell of the power source via a unidirectional current conduction device, the instructions comprising:
- a program code for determining a reference voltage using a reference transformer; and
- a program code for determining the cell voltages based on the reference voltage using the sensing transformers, a single sensing transformer being used for determining voltage of the individual cell.

22. The computer-readable medium of claim 21, wherein the program code for determining the cell voltages includes a code to excite the sensing transformers and a code to sample voltage at the first winding of each of the sensing transformers when excited.

23. The computer-readable medium of claim 22, wherein the reference transformer includes a first winding configured for coupling to the processor and a second winding configured for coupling to a voltage reference, and wherein the program code for determining the reference voltage includes a code to excite the first winding of the reference transformer, and a code to sample the voltage at the first winding of the reference transformer when exited.

24. The computer-readable medium of claim 21, wherein the instructions further comprise a program code to correct the voltage sampled at the first winding of each of the sensing transformers for residual error.

* * * * *